United States Patent
Arao et al.

(10) Patent No.: US 9,235,016 B2
(45) Date of Patent: Jan. 12, 2016

(54) ELECTRONIC DEVICE WITH CABLE AND METHOD OF ASSEMBLING THE SAME

(71) Applicant: SUMITOMO ELECTRIC INDUSTRIES, LTD., Osaka-shi, Osaka (JP)

(72) Inventors: Hajime Arao, Yokohama (JP); Toshihisa Yokochi, Yokohama (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/355,009

(22) PCT Filed: Oct. 17, 2013

(86) PCT No.: PCT/JP2013/078229
§ 371 (c)(1),
(2) Date: Apr. 29, 2014

(87) PCT Pub. No.: WO2014/069246
PCT Pub. Date: May 8, 2014

(65) Prior Publication Data
US 2015/0185427 A1 Jul. 2, 2015

(30) Foreign Application Priority Data

Nov. 1, 2012 (JP) ................. 2012-241901

(51) Int. Cl.
*G02B 6/36* (2006.01)
*G02B 6/42* (2006.01)
(Continued)

(52) U.S. Cl.
CPC ............ *G02B 6/4268* (2013.01); *G02B 6/4257* (2013.01); *G02B 6/4269* (2013.01); *H01S 5/02216* (2013.01); *H01S 5/02284* (2013.01); *H01S 5/02469* (2013.01)

(58) Field of Classification Search
CPC .. G02B 6/4292; G02B 6/4246; G02B 6/4201; G02B 6/4204; G02B 6/4277; G02B 6/4268; G02B 6/4257; G02B 6/4269
USPC .......................................................... 385/92
See application file for complete search history.

(56) References Cited

U.S. PATENT DOCUMENTS

| 8,488,324 B2 | 7/2013 | Becker et al. |
| 8,632,261 B2 | 1/2014 | Zhao et al. |

(Continued)

FOREIGN PATENT DOCUMENTS

| CN | 2519585 Y | 10/2002 |
| CN | 1720473 A | 1/2006 |

(Continued)

OTHER PUBLICATIONS

English-language translation of International Search Report (ISR) dated Dec. 24, 2013 that issued in WO Patent Application No. PCT/JP2013/078229.

*Primary Examiner* — Jerry Blevins
(74) *Attorney, Agent, or Firm* — Drinker Biddle & Reath LLP

(57) ABSTRACT

The electronic device with cable includes a circuit substrate provided with a heat generating element mounted thereon, an electrical connector connected to one end of the circuit substrate, a cable that is connected to the other end of the circuit substrate, heat conducting sheets and disposed in the circuit substrate, a first metal housing including an accommodation portion accommodating the electrical connector and a pair of wall portions communicating with the accommodation portion, a second metal housing fitted to the first metal housing so as to cover a one-side opening of the pair of wall portions, and a third metal housing fitted to the second metal housing so as to cover the other-side opening of the pair of wall portions. The cable and the first metal housing are thermally connected to each other.

8 Claims, 12 Drawing Sheets

(51) Int. Cl.
 *H01S 5/022* (2006.01)
 *H01S 5/024* (2006.01)

(56) References Cited

U.S. PATENT DOCUMENTS

| | | |
|---|---|---|
| 8,961,038 B2 | 2/2015 | Zhao et al. |
| 2006/0140551 A1 | 6/2006 | Yu et al. |
| 2006/0239621 A1 | 10/2006 | Loe et al. |
| 2010/0202110 A1* | 8/2010 | Becker et al. ............... 361/707 |
| 2012/0240396 A1 | 9/2012 | Becker et al. |
| 2013/0271923 A1* | 10/2013 | Smethurst ............... 361/728 |

FOREIGN PATENT DOCUMENTS

| | | |
|---|---|---|
| CN | 101690437 A | 3/2010 |
| CN | 101813810 A | 8/2010 |
| CN | 202018526 U | 10/2011 |
| CN | 102236136 A | 11/2011 |
| JP | 2010-010254 A | 1/2010 |
| JP | 2011-159704 A | 8/2011 |
| JP | 2011-205102 A | 10/2011 |
| JP | 2012-181442 A | 9/2012 |

\* cited by examiner

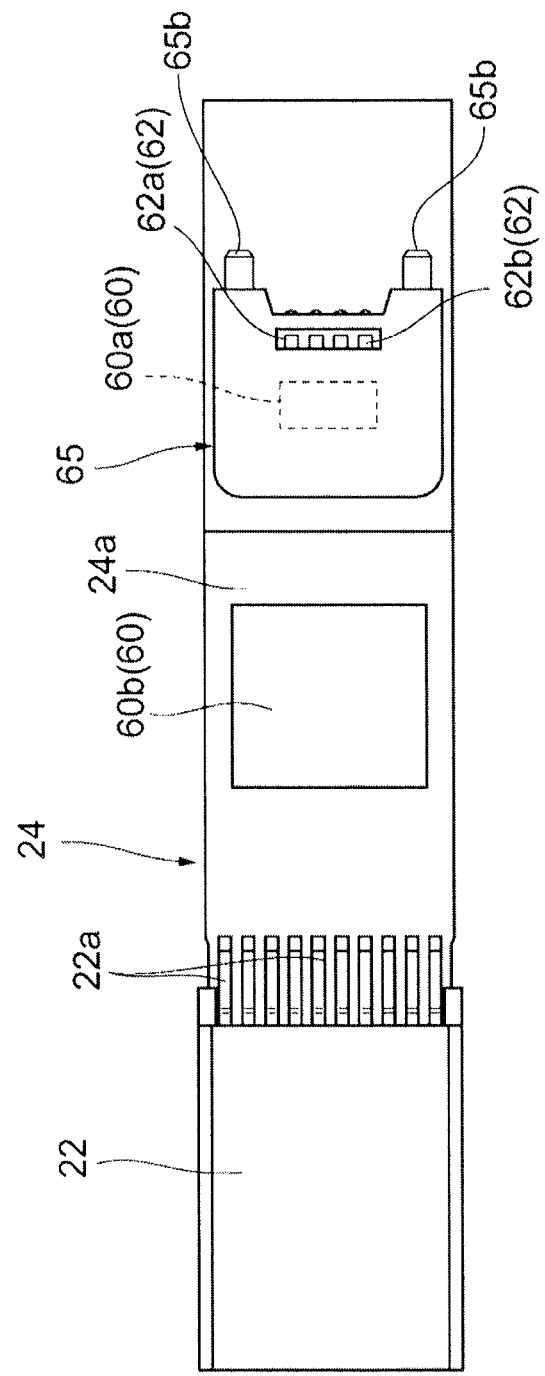

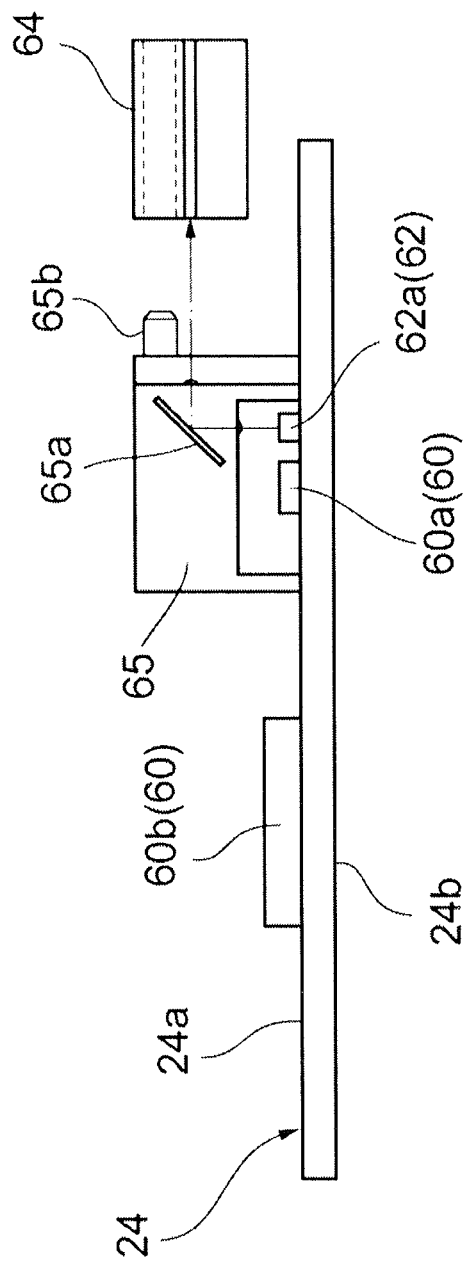

ELECTRONIC DEVICE WITH CABLE AND METHOD OF ASSEMBLING THE SAME

TECHNICAL FIELD

The present invention relates to an electronic device with cable and a method of assembling the same.

BACKGROUND OF THE INVENTION

Patent Literature 1 discloses a photoelectric conversion module in which an electrical connector and a substrate connected to the electrical connector are accommodated in a metal case.

CITATION LIST

Patent Literature

[PTL 1] JP-A-2010-10254

SUMMARY OF INVENTION

In assembling the photoelectric conversion module disclosed in Patent Literature 1, at the time of connecting the electrical connector to the substrate and covering the electrical connector and the substrate by the metal case, a method may be adopted of pushing the electrical connector and the substrate into the metal case from an opening of the metal case to accommodate them. At this time, spacers (heat conduction sheets) disposed on both sides of the substrate are pushed by coming into contact with an internal surface of the metal case, and thus there is a possibility of a positional deviation of the heat conduction sheets occurring. For this reason, the workability and yield of the assembling may deteriorate.

In addition, in the photoelectric conversion module disclosed in Patent Literature 1, it is necessary to design the entire module in consideration of heat generated by a photoelectric conversion unit.

Consequently, an object of the present invention is to provide an electronic device with cable which is capable of preventing a positional deviation of a heat conducting sheet and has high heat radiation performance, and a method of assembling the same.

In order to achieve the above-described object, an electronic device with cable of the present invention includes: a circuit substrate on which a heat generating element is mounted; an electrical connector that is connected to one end of the circuit substrate; a cable connected to the other end of the circuit substrate; a heat conducting sheet disposed in at least a portion of the circuit substrate; a first metal housing including an accommodation portion which accommodates the electrical connector, and a pair of wall portions which communicate with the accommodation portion; a second metal housing fitted to the first metal housing so as to cover a one-side opening of the pair of wall portions; and a third metal housing fitted to the second metal housing so as to cover the other-side opening of the pair of wall portions. The circuit substrate is accommodated between the pair of wall portions. The heat conducting sheet is accommodated in an accommodation space, formed by the fitting of the first metal housing and the second metal housing and the fitting of the second metal housing and the third metal housing, so as to come into contact with at least one of the second metal housing and the third metal housing. The cable and the first metal housing are thermally connected to each other.

In addition, in the electronic device with cable of the present invention, the cable may include a heat conduction member having a higher thermal conductivity than the first metal housing, the second metal housing, and the third metal housing.

In addition, in the electronic device with cable of the present invention, a side surface of the second metal housing and a side surface of the third metal housing are fixed so as to overlap each other on the outside of the pair of wall portions, so that the first metal housing, the second metal housing, and the third metal housing may be thermally connected to each other.

In addition, in the electronic device with cable of the present invention, the first metal housing may include a first convex portion, the second metal housing may include a first concave portion, provided at a location corresponding to the first convex portion, and a second convex portion, the third metal housing may include a second concave portion provided at a location corresponding to the second convex portion, each of the first convex portion and the second convex portion may have a slit in one side thereof, and one side of the slit has a convex shape, the first concave portion may engage with the first convex portion to fix the second metal housing to the first metal housing, and the second concave portion may engage with the second convex portion to fix the third metal housing to the second metal housing.

Further, in order to achieve the above-described object, a method of assembling an electronic device with cable includes steps of: preparing a circuit substrate having one end connected to an electrical connector; accommodating the electrical connector in an accommodation portion of a first metal housing and accommodating the circuit substrate between a pair of wall portions that communicate with the accommodation portion; connecting a cable to the other end of the circuit substrate; and disposing a heat conducting sheet in at least a portion of the circuit substrate. A second metal housing is fitted to the first metal housing so as to cover a one-side opening of the pair of wall portions, and then a third metal housing is fitted to the second metal housing so as to cover the other-side opening of the pair of wall portions. The heat conducting sheet comes into contact with at least one of the second metal housing and the third metal housing. The cable and the first metal housing are thermally connected to each other.

In addition, in the method of assembling an electronic device with cable, the second metal housing may be fixed to the first metal housing so that a side surface of the second metal housing covers the pair of wall portions, and the third metal housing may be fixed to the second metal housing so as to cover the side surface of the second metal housing.

ADVANTAGEOUS EFFECTS OF INVENTION

According to the present invention, it is possible to provide an electronic device with cable which is capable of preventing a positional deviation of a heat conducting sheet during assembling and has high heat radiation performance.

BRIEF DESCRIPTION OF DRAWINGS

FIG. 5A is a top view of the circuit substrate shown in FIG. 4.

FIG. 5B is a side view of the circuit substrate shown in FIG. 4.

DESCRIPTION OF EMBODIMENTS

An optical module 1 (example of electronic device with cable) according to an embodiment of the present invention is used for signal (data) transmission in optical communication technology and the like. The optical module 1, which is electrically connected to an electronic device such as a personal computer, converts an input/output electrical signal into an optical signal and transmits the optical signal.

Figure 1:
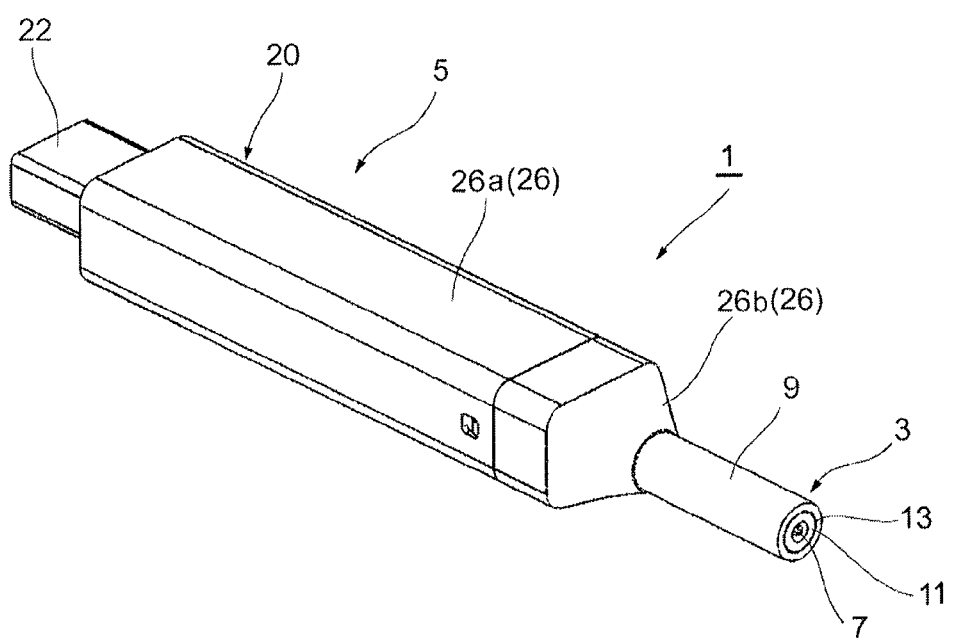
FIG. 1 is a perspective view showing an optical module according to this embodiment.

As shown in FIG. 1, the optical module 1 includes an optical cable 3 and a connector module 5. The optical module 1 is configured such that a terminal of the single-fiber or multi-fiber optical cable 3 is attached to the connector module 5.

Figure 6:
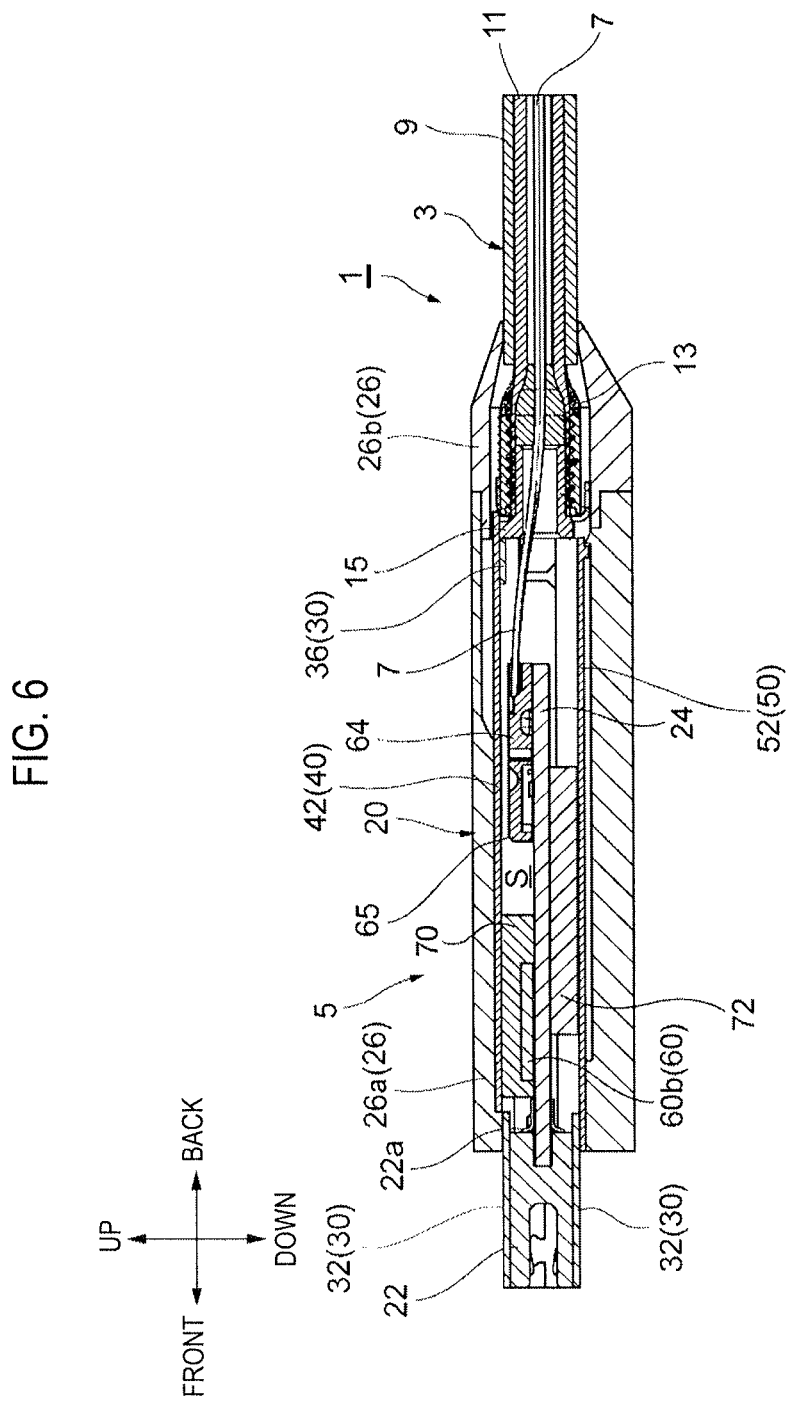
FIG. 6 is a cross-sectional view of the optical module shown in FIG. 1.

As shown in FIG. 1 and FIG. 6, the optical cable 3 includes a plurality of coated optical fibers 7, a jacket 9 that is formed of a resin and covers the coated optical fibers 7, tensile strength fibers (Kevlar (registered trademark)) 11 which are interposed between the coated optical fibers 7 and the jacket 9 and have an ultrafine diameter, and a metal braid (metal layer) 13 that is interposed between the jacket 9 and the tensile strength fibers 11. In other words, in the optical cable 3, the coated optical fibers 7, the tensile strength fibers 11, the metal braid 13, and the jacket 9 are disposed in this order toward the outside in the radial direction from the center thereof.

An optical fiber in which a core and a cladding are quartz glass (AGF: All Glass Fiber), an optical fiber in which a cladding is formed of rigid plastic (HPCF: Hard Plastic Clad Fiber), or the like can be used as the coated optical fiber 7. When a thin HPCF having a glass core diameter of 80 μm is used, the coated optical fiber 7 is not likely to be broken even if the coated optical fiber is bent in a curve with a small diameter. The jacket 9 is formed of, for example, PVC (polyvinylchloride) which is a non-halogen fire-retardant resin. An external diameter of the jacket 9 is approximately 4.2 mm, and a thermal conductivity of the jacket 9 is, for example, 0.17 W/m·K. The tensile strength fiber 11 is, for example, an aramid fiber, and is embedded in the optical cable 3 in a state where the tensile strength fibers are gathered in the form of a bundle.

The metal braid 13 is formed of, for example, a tinned electrically-conductive wire. A braid density is equal to or greater than 70%, and a braided angle is 45 to 60 degrees. An external diameter of the metal braid 13 is approximately 0.05 mm. The metal braid 13 is configured as a heat conduction member having a higher thermal conductivity than a metal housing 28 to be described later. The thermal conductivity is, for example, 400 W/m·K. It is preferable that the metal braid 13 be disposed at a high density in order to satisfactorily secure heat conduction, and as an example, it is preferable that the metal braid be formed of a tinned electrically-conductive wire which is a rectangular wire.

The connector module 5 includes a housing 20, an electrical connector 22 provided on the front end (tip) side of the housing 20, and a circuit substrate 24 accommodated in the housing 20. The housing 20 is constituted by a resin housing 26 and a metal housing 28 (see FIG. 2) that is disposed within the resin housing 26.

The resin housing 26 is formed of, for example, a resin material such as polycarbonate and covers the metal housing 28. The resin housing 26 has an exterior housing 26a and a boot 26b that is connected to the exterior housing 26a. The exterior housing 26a is provided so as to cover an external surface of the metal housing 28. The boot 26b is connected to a back end portion of the exterior housing 26a and covers fixation portions of the metal housing 28 and the optical cable 3. The back end portion of the boot 26b and the jacket 9 of the optical cable 3 are attached to each other by an adhesive (not shown).

Figure 2:
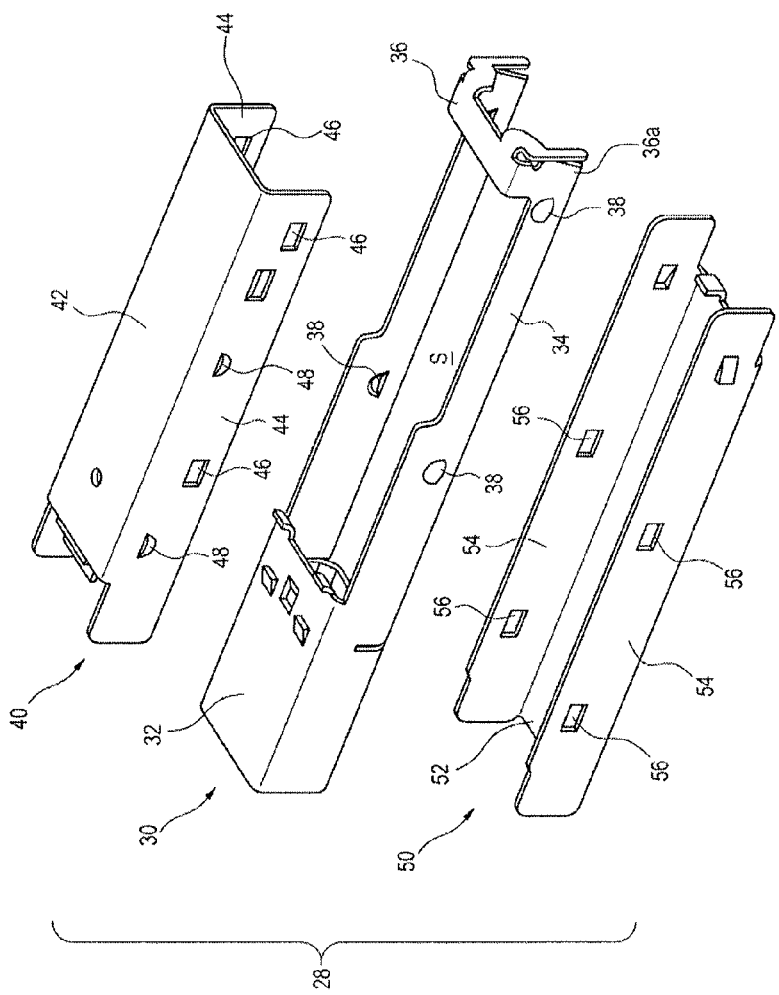
FIG. 2 is a perspective view showing first to third metal housings of the optical module shown in FIG. 1.

As shown in FIG. 2, the metal housing 28 is constituted by a first metal housing 30, a second metal housing 40, and a third metal housing 50. The metal housings 30, 40, and 50 are formed of a metal material such as steel (Fe-based), a tin plate (tinned copper), stainless steel, copper, brass, or aluminum, which has a high thermal conductivity (preferably equal to or greater than 100 W/m·K), and constitute a thermal conductor.

The first metal housing 30 defines an accommodation space S in which the circuit substrate 24 and the like are accommodated. The electrical connector 22 is provided on the front end side of the first metal housing 30, and the optical cable 3 is connected to the back end side of the first metal housing 30 through a connecting portion 15 formed of a metal plate. The first metal housing 30 has a tube portion 32 (example of accommodation portion) which accommodates the electrical connector 22 at the front end thereof, a pair of side surfaces 34 (example of a pair of wall portions) which communicate with the tube portion 32 and hold the circuit substrate 24 on the inner wall surfaces thereof, and a fixation portion 36 that communicates with the pair of side surfaces 34 and has the optical cable 3 fixed thereto.

Figure 3:
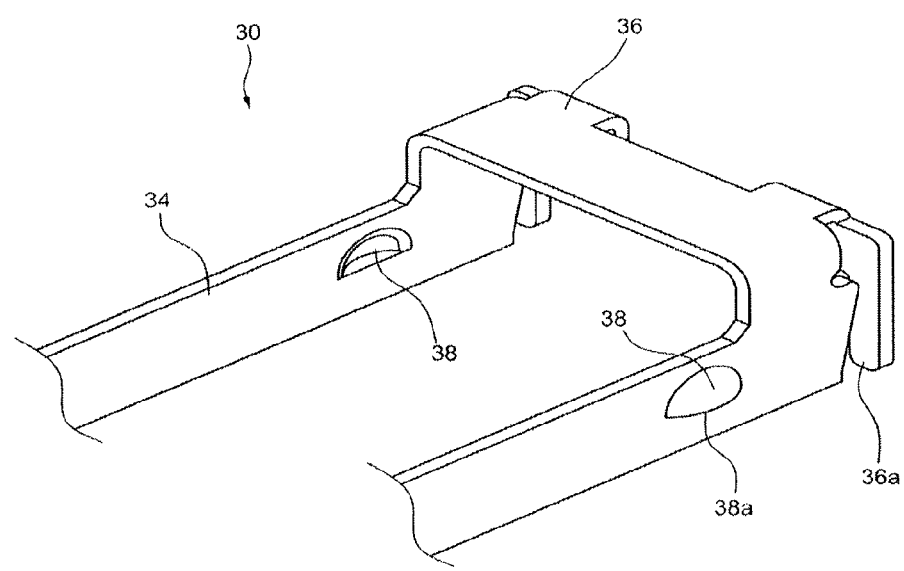
FIG. 3 is a partially enlarged perspective view of the first metal housing.

As shown in FIG. 3, a first convex portion 38 has a slit 38a in one side thereof, and one side of the slit 38a has a convex shape. Each of the pair of side surfaces 34 has at least one (herein, two for each side surface 34) first convex portion 38. In addition, the fixation portion 36 has a slit 36a in the back end portion thereof. The connecting portion 15 (see FIG. 4) mounted in the optical cable 3 is inserted into the slit 36a.

As shown in FIG. 2, the second metal housing 40 has a substantially U-shaped cross-section and is opened downwards. The second metal housing 40 has a facing surface 42 that faces the circuit substrate 24 and a pair of side surfaces 44 that are perpendicular to the facing surface 42. Each of the pair of side surfaces 44 has a first concave portion 46 that is provided at a location corresponding to the first convex portion 38 provided in the side surface 34 of the first metal housing 30, to engage with the first convex portion 38, and has a second convex portion 48.

The third metal housing 50 has a substantially U-shaped cross-section and is opened upwards. The third metal housing 50 has a facing surface 52 that faces the circuit substrate 24 and a pair of side surfaces 54 that are perpendicular to the facing surface 52. Each of the pair of side surfaces 54 has a second concave portion 56 that is provided at a location corresponding to the second convex portion 48 provided in the side surface 44 of the second metal housing 40, to engage with the second convex portion 48.

In this manner, the first convex portion 38 of the first metal housing 30 engages with the first concave portion 46 of the second metal housing 40, and the second convex portion 48 of the second metal housing 40 engages with the second concave portion 56 of the third metal housing, and thus the side surfaces 44 of the second metal housing 40 and the side surfaces 54 of the third metal housing 50 are fixed so as to overlap each other on the outside of the pair of side surfaces (wall portions) 34 of the first metal housing 30. Thus, the first metal housing 30, the second metal housing 40, and the third metal housing 50 are physically and thermally connected to each other.

The electrical connector 22 is a portion inserted into a connection target (personal computer, etc.) and electrically connected to the connection target. As shown in FIG. 1, the electrical connector 22 is disposed on the front end side of the housing 20, and protrudes forward from the metal housing 28. The electrical connector 22 is electrically connected to the circuit substrate 24 by a contactor 22a.

Figure 4:
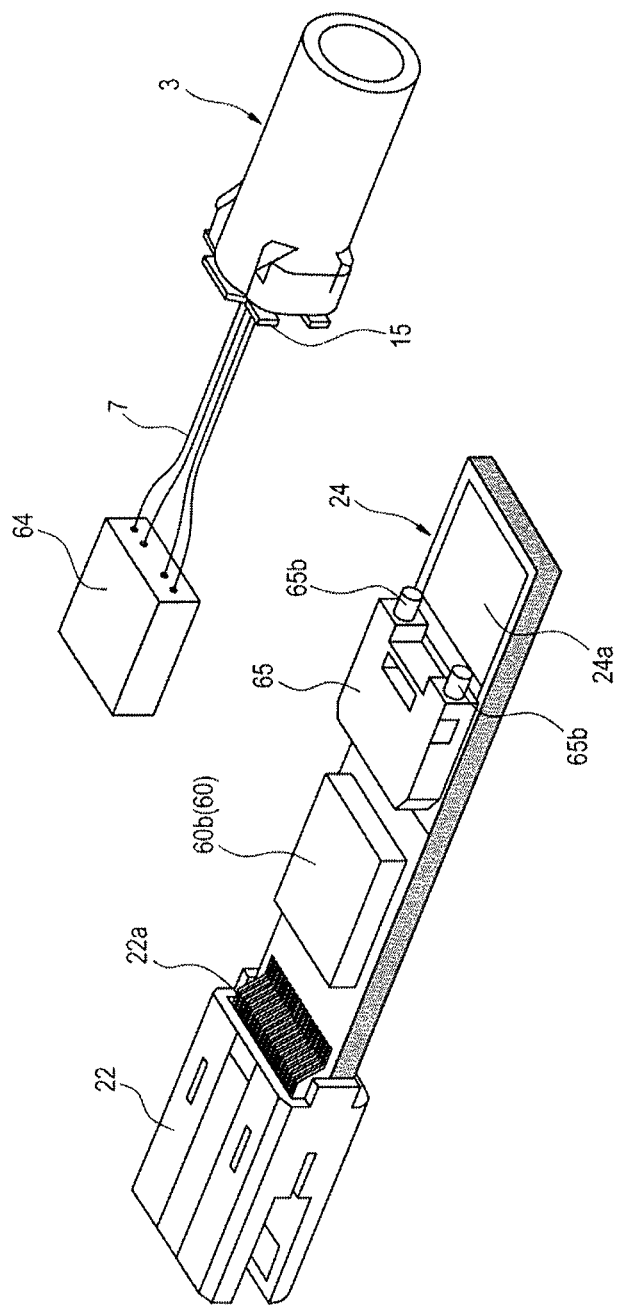
FIG. 4 is a perspective view showing a circuit substrate and a cable which are embedded into the optical module shown in FIG. 1.

The circuit substrate 24 is a member accommodated in the accommodation space S of the first metal housing 30. As shown in FIG. 4 and FIGS. 5A and 5B, a control semiconductor 60 and a light receiving and emitting element 62 (example of heat generating element) are mounted on the circuit substrate 24. The circuit substrate 24 electrically connects the control semiconductor 60 and the light receiving and emitting element 62. The circuit substrate 24 has a substantially rectangular shape when seen in a plan view and has a predetermined thickness. For example, the circuit substrate 24 is an insulated substrate such as a glass epoxy substrate or a ceramic substrate, and a circuit wiring formed of, for example, gold (Au), aluminum (Al), or copper (Cu) is formed in the surface of the circuit substrate or inside the circuit substrate. The control semiconductor 60 and the light receiving and emitting element 62 constitute a photoelectric conversion unit.

The control semiconductor 60 includes, for example, a driving integrated circuit (IC) 60a and a clock data recovery (CDR) device 60b which is a waveform shaper. The control semiconductor 60 is disposed on the front end side of a surface 24a in the circuit substrate 24 and is electrically connected to the electrical connector 22.

The light receiving and emitting element 62 is disposed on the back end side of the surface 24a in the circuit substrate 24, and includes a plurality of light emitting elements 62a and a plurality of light receiving elements 62b. For example, a light emitting diode (LED), a laser diode (LD), or a vertical cavity surface emitting laser (VCSEL) can be used as the light emitting element 62a. For example, a photodiode (PD) can be used as the light receiving element 62b.

The light receiving and emitting element 62 is optically connected to the coated optical fibers 7 of the optical cable 3. Specifically, as shown in FIG. 5B, a lens array component 65 is disposed in the circuit substrate 24 so as to cover the light receiving and emitting element 62 and the driving IC 60a. The lens array component 65 is provided with a reflection film 65a that reflects and bends light emitted from the light emitting element 62a or light emitted from the coated optical fibers 7. A connector component 64 is attached to a terminal of the coated optical fiber 7 that is extracted from the optical cable 3. The connector component 64 and the lens array component 65 are positioned using a positioning pin 65b of the lens array component 65 to be coupled to each other, and thus the coated optical fibers 7 and the light receiving and emitting element 62 are optically connected to each other. It is preferable that the lens array component 65 include a collimating lens in a light incident portion and a light emitting portion thereof. The collimating lens converts incident light into parallel light, and condenses and emits the parallel light. The lens array component 65 can be integrally configured by injection molding using a resin.

As shown in FIG. 6, a first heat conducting sheet 70 is disposed in the accommodation space S. The first heat conducting sheet 70 is a thermal conductor that is formed of a material with thermal conductivity and flexibility. The first heat conducting sheet 70 is provided between the surface 24a of the circuit substrate 24 and the second metal housing 40, and is mounted so as to cover the CDR device 60b mounted on the surface 24a of the circuit substrate 24. The first heat conducting sheet 70 comes into contact with the surface of the CDR device 60b, the surface 24a of the circuit substrate 24, and the inner wall surface of the facing surface 42 of the second metal housing 40.

As described above, in the first heat conducting sheet 70, the bottom surface thereof is physically and thermally connected to the surface 24a of the circuit substrate 24 and the CDR device 60b, and the top thereof is physically and thermally connected to an inner wall surface of the facing surface 42 of the second metal housing 40. The circuit substrate 24 and the second metal housing 40 are thermally connected to each other by the first heat conducting sheet 70, and thus heat of the circuit substrate 24 is transferred to the second metal housing 40.

In addition, a second heat conducting sheet 72 is disposed in the accommodation space S. The second heat conducting sheet 72 is provided between a rear surface 24b of the circuit substrate 24 and the third metal housing 50. The second heat conducting sheet 72 is mounted in a portion on the other side of a region where the CDR device 60b is mounted and a region where the lens array component 65 is mounted in the surface 24a of the circuit substrate 24. The second heat conducting sheet 72 comes into contact with the rear surface 24b of the circuit substrate 24 and an inner wall surface of the facing surface 52 of the third metal housing 50.

As described above, in the second heat conducting sheet 72, the top surface thereof is physically and thermally connected to the rear surface 24b of the circuit substrate 24, and the bottom surface thereof is physically and thermally connected to the inner wall surface of the facing surface 52 of the third metal housing 50. The circuit substrate 24 and the third metal housing 50 are thermally connected to each other by the second heat conducting sheet 72, and thus heat of the circuit substrate 24 is transferred to the third metal housing 50.

Next, a method of assembling the optical module 1 will be described with reference to FIG. 7A to FIG. 10.

Figure 7A:
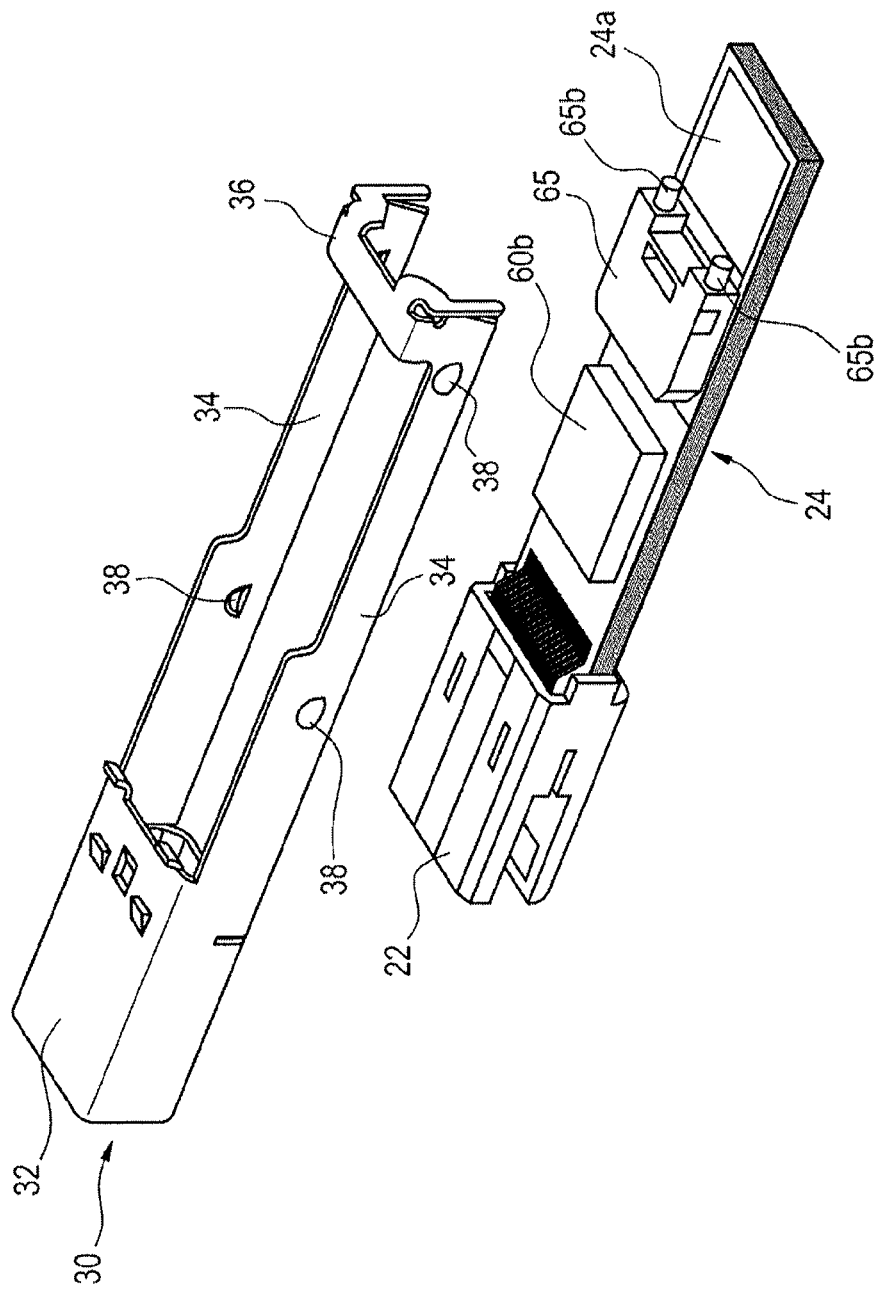
FIG. 7A is a perspective view showing a state before the circuit substrate is embedded into the first metal housing.
Figure 7B:
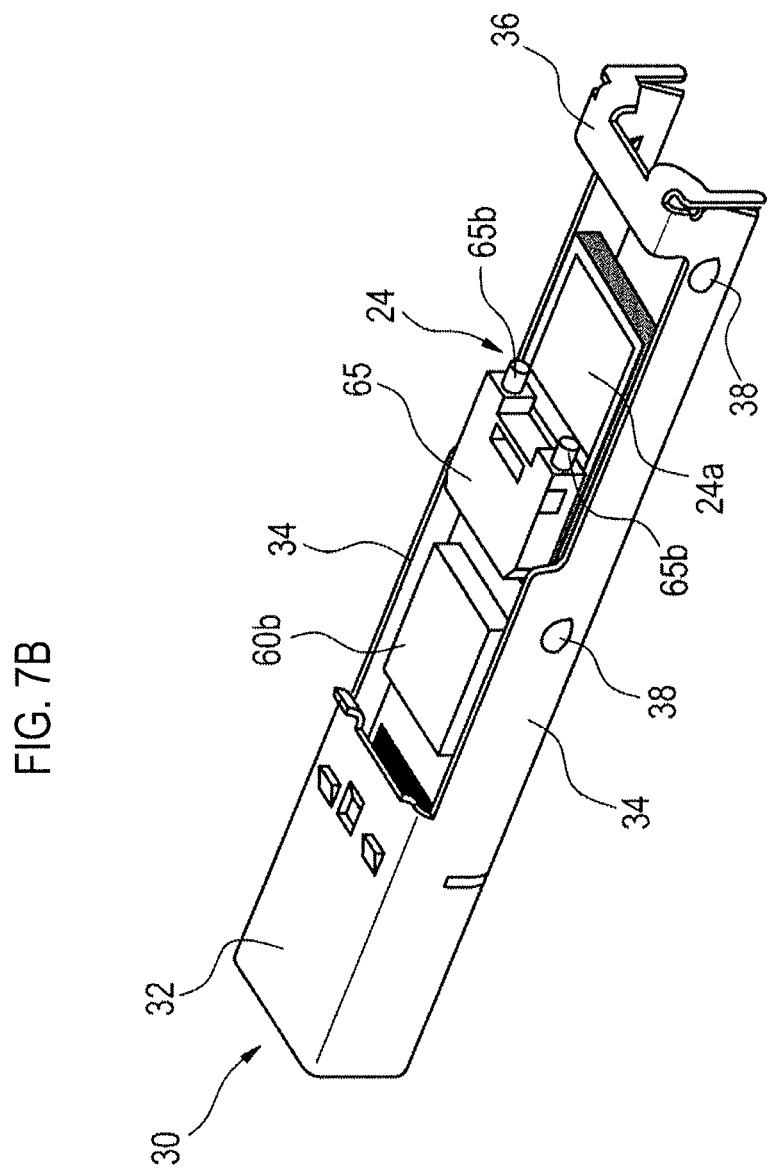
FIG. 7B is a perspective view showing a state after the circuit substrate is embedded into the first metal housing.

First, as shown in FIG. 7A, the first metal housing 30 and the circuit substrate 24 that is integrated by connecting the electrical connector 22 to one end thereof are prepared. Next, as shown in FIG. 7B, the electrical connector 22 is inserted into the tube portion 32 of the first metal housing 30 from behind, and the circuit substrate 24 is disposed between the pair of side surfaces 34 of the first metal housing 30.

Figure 8:
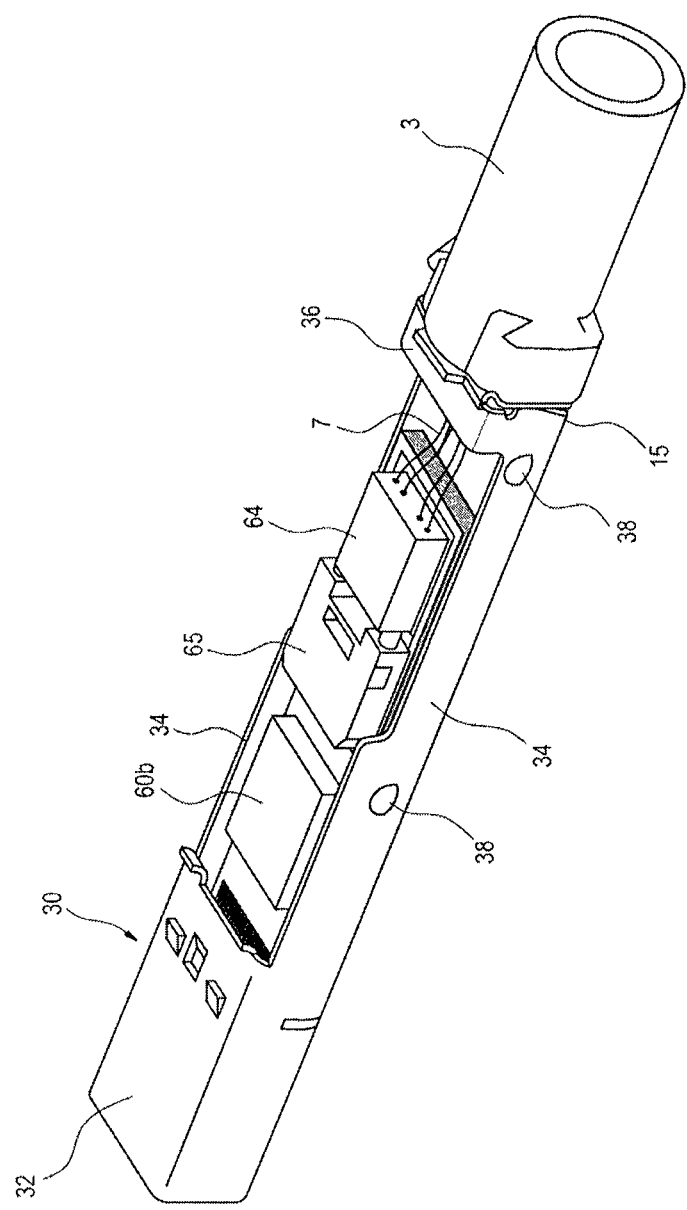
FIG. 8 is a perspective view showing a state where a connector component connected to the cable is connected to the circuit substrate embedded into the first metal housing.

Next, as shown in FIG. 8, the connector component 64 connected to the coated optical fibers 7, extracted from the optical cable 3, passes under the fixation portion 36 of the first metal housing 30 and is then disposed between the pair of side surfaces 34 of the first metal housing 30. The connecting portion 15 attached to the optical cable 3 is inserted into the slit 36a of the fixation portion 36 of the first metal housing 30 so as to be fixed. Thus, the optical cable 3 and the first metal housing 30 are thermally connected to each other.

The connector component 64 and the lens array component 65 are coupled to each other by being positioned using the positioning pin 65b of the lens array component 65.

Figure 9:
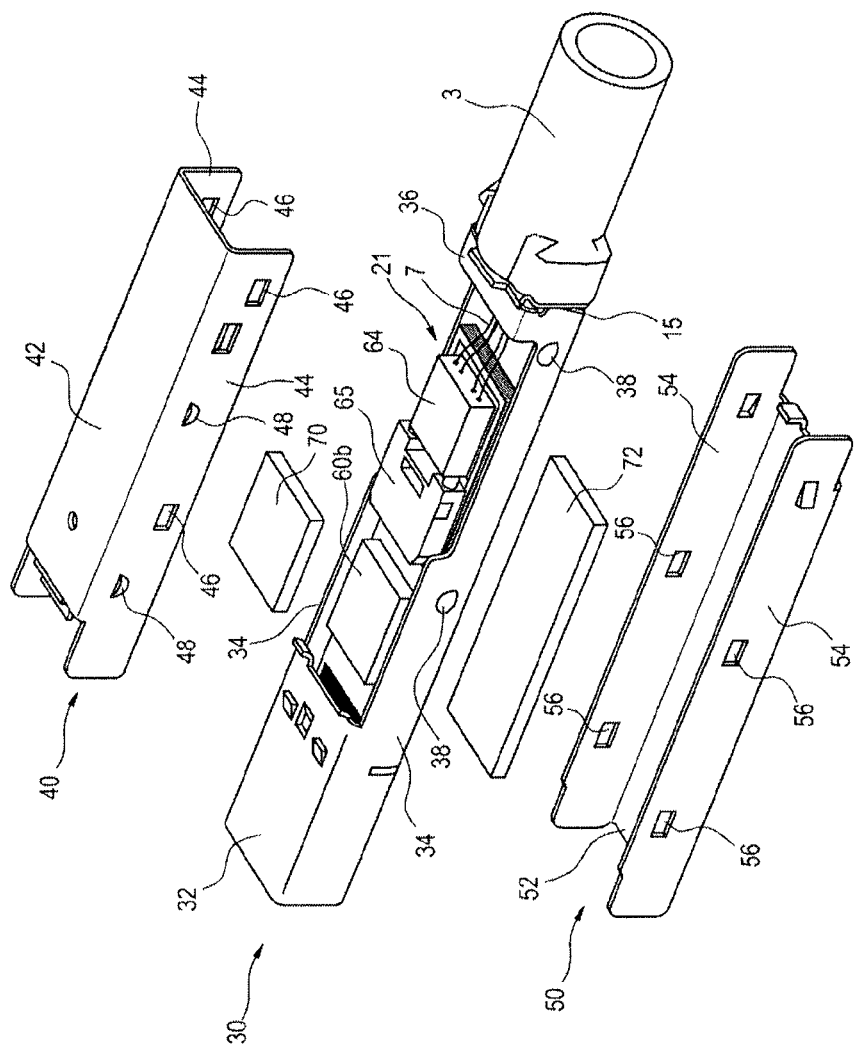
FIG. 9 is a perspective view showing a state before a heat conducting sheet is provided on both surfaces of the circuit substrate and the first metal housing, a second metal housing, and a third metal housing are fixed.

Next, as shown in FIG. 9, the first heat conducting sheet 70 is disposed so as to cover the CDR device 60b mounted on the surface 24a of the circuit substrate 24, and the second heat conducting sheet 72 is disposed so as to cover the rear surface 24b corresponding to the region where the CDR device 60b is mounted and the region where the lens array component 65 is mounted.

In this state, the second metal housing 40 is fit from above so as to cover an upper opening (example of one-side opening) of the pair of side surfaces 34 of the first metal housing 30, and the first convex portion 38 provided in each of the pair of side surfaces 34 of the first metal housing 30 engages with the first concave portion 46 provided in the side surface 44 of the second metal housing 40. Thus, the first heat conducting sheet 70 comes into contact with the inner wall surface of the facing surface 42 of the second metal housing 40. Further, in this state, the third metal housing 50 is fit from below so as to cover a lower opening (the other-side opening) of the pair of side surfaces 34 of the first metal housing 30, and the second convex portion 48 provided in each of the pair of side surfaces 44 of the second metal housing 40 engages with the second concave portion 56 provided in the side surface 54 of the third metal housing 50. Thus, the second heat conducting sheet 72 comes into contact with the inner wall surface of the facing surface 52 of the third metal housing 50.

Figure 10:
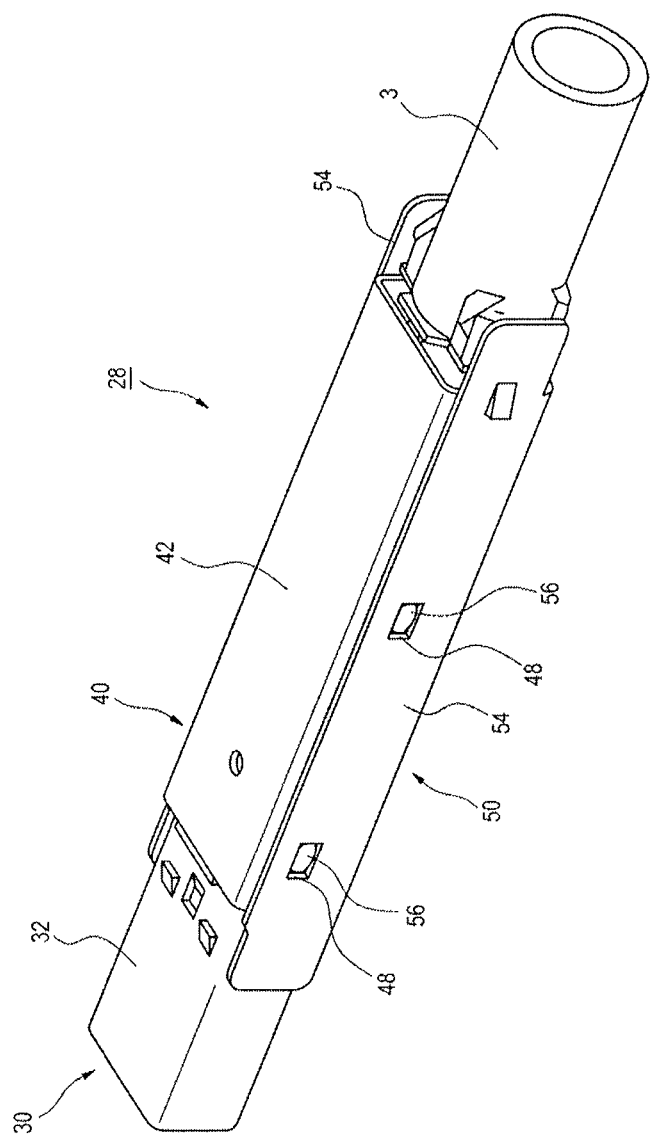
FIG. 10 is a perspective view showing a state where the first metal housing, the second metal housing, and the third metal housing are fixed.

In this manner, the first metal housing 30, the second metal housing 40, and the third metal housing 50 are fit to each other, and thus the electrical connector 22, the circuit substrate 24, and the first and second heat conducting sheets 70 and 72 are accommodated in the accommodation space S that is defined by the first metal housing 30, the second metal housing 40, and the third metal housing 50, as shown in FIG. 10.

In the optical module 1 configured as described above, an electrical signal is input from the electrical connector 22, and an electrical signal is input to the control semiconductor 60 through a wiring of the circuit substrate 24. The electrical signal input to the control semiconductor 60 is output to the light emitting element 62a from the control semiconductor 60 through the wiring of the circuit substrate 24 after performing level adjustment, waveform shaping using the CDR device 60b, and the like. The light emitting element 62a having the electrical signal input thereto converts the electrical signal to an optical signal, and emits the optical signal to the coated optical fiber 7.

In addition, the optical signal transmitted through the optical cable 3 is input to the light receiving element 62b from the coated optical fiber 7. The light receiving element 62b converts the input optical signal to an electrical signal, and outputs the electrical signal to the control semiconductor 60 through a wiring of the circuit substrate 24. The control semiconductor 60 performs predetermined processing on the electrical signal, and then outputs the electrical signal to the electrical connector 22.

Subsequently, a heat radiation method in the optical module 1 will be described with reference to FIG. 6. Heat generated by the control semiconductor 60 and the light receiving and emitting element 62 which are mounted on the circuit substrate 24 is first transferred to the circuit substrate 24. The heat transferred to the circuit substrate 24 is transferred to the first heat conducting sheet 70 and the second heat conducting sheet 72. The heat through the first heat conducting sheet 70 is mainly transferred to the facing surface 42 of the second metal housing 40, and the heat through the second heat conducting sheet 72 is mainly transferred to the facing surface 52 of the third metal housing 50. The heat transferred to the facing surfaces 42 and 52 is diffused to an overlapping portion constituted by the side surface 34 of the first metal housing, the side surface 44 of the second metal housing, and the side surface 54 of the third metal housing 50.

Next, the heat is transferred from the side surface 34 of the first metal housing to the fixation portion 36 communicating with the side surface, and is transferred to the metal braid 13 of the optical cable 3 that is connected to the fixation portion 36. Then, the heat transferred to the metal braid 13 is radiated to the outside through the jacket 9 of the optical cable 3. As described above, in the optical module 1, heat generated by the control semiconductor 60 and the light receiving and emitting element 62, which are heating elements, is discharged to the outside.

In addition, since the electrical connector 22 of the optical module 1 is connected to an external device such as a personal computer, heat from the external device is transferred to the electrical connector 22. The heat is transferred to the tube portion 32 of the first metal housing 30 which accommodates the electrical connector 22, and is then transferred to the metal braid 13 of the optical cable 3 through the overlapping portion constituted by the side surfaces 34, 44, and 54 and the fixation portion 36. Thereafter, the heat is radiated to the outside through the jacket 9 of the optical cable 3. As described above, in the optical module 1, heat transferred to the electrical connector 22 from the external device is discharged to the outside.

As described above, according to this embodiment, the metal housing 28 is constituted by three members of the first, second, and third metal housings 30, 40, and 50, and thus it is possible to fix the circuit substrate 24 to the first metal housing 30, to confirm the first and second heat conducting sheets 70 and 72 being mounted at a predetermined location, and then to mount the second and third metal housings 40 and 50 from above and below of the first metal housing 30, respectively. Thus, it is possible to easily assemble the optical module 1 without causing positional deviations of the first and second heat conducting sheets 70 and 72 and to improve the workability and yield of the assembling. That is, this embodiment is particularly suitable for a case where a heat conducting sheet is disposed on both the surface 24a and the rear surface 24b of the circuit substrate 24.

In addition, since the optical cable 3 and the first metal housing 30 are thermally connected to each other, it is possible to allow heat from the optical module 1 to escape to the optical cable 3 side. For this reason, it is possible to increase heat radiation performance of the optical module 1.

Further, according to this embodiment, the optical cable 3 includes, for example, the metal braid 13 as a heat conduction member having a higher thermal conductivity than the first metal housing 30, the second metal housing 40, and the third metal housing 50. For this reason, heat transferred from the external device connected to the electrical connector 22 of the optical module 1 is preferentially diffused to the optical cable 3 side, and thus it is possible to further increase heat radiation performance on the optical cable 3 side.

In addition, according to this embodiment, the side surfaces 44 of the second metal housing 40 and the side surfaces 54 of the third metal housing 50 are fixed so as to overlap each other on the outside of the pair of side surfaces (wall portions) 34 of the first metal housing 30, and thus the first metal housing 30, the second metal housing 40, and the third metal housing 50 are thermally connected to each other. For this reason, it is possible to allow heat, generated from the optical module 1 and which is diffused to the second metal housing 40 and the third metal housing 50 through the first and second heat conducting sheets 70 and 72, to efficiently escape to the optical cable 3 side that is thermally connected to the first metal housing 30.

In addition, according to this embodiment, the first convex portion 38, having the slit 38a in one side thereof, and the second convex portion 48 are provided. For this reason, it is possible to secure the strength thereof as compared with, for example, a convex portion of the related art which has a cut-and-raised shape in which a slit is provided in three sides.

Although the present invention has been described so far in detail with reference to a specific embodiment, it will be obvious to those skilled in the art that various changes and modifications may be made without departing from the scope of the invention.

For example, the optical module 1 may be configured by using the metal housing 28, having features included in the above-described embodiment, as an outermost housing without providing the resin housing 26.

In addition, according to the above-described embodiment, a description has been made of an example in which the first heat conducting sheet 70 and the second heat conducting sheet 72 are provided on both the surface 24a side and the rear surface 24b side of the circuit substrate 24, respectively. However, a configuration may be made such that a heat conducting sheet is provided only between the surface 24a of the circuit substrate 24 and the inner wall surface of the second metal housing 40 without providing the heat conducting sheet 72 between the rear surface 24b of the circuit substrate 24 and the inner wall surface of the third metal housing 50. Also in this configuration, the metal housing 28 is divided into three members (the first, second, and third metal housings 30, 40, and 50), and thus it is possible to mount the circuit substrate 24 in the first metal housing 30, to confirm the heat conducting sheet 70 being reliably mounted at a predetermined location, and then to fit the second and third metal housings 40 and 50 to each other. For this reason, it is possible to allow even an inexperienced worker to easily perform assembling.

Meanwhile, the first and second heat conducting sheets 70 and 72 may be provided so as to come into contact with the side surfaces 34 of the first metal housing, respectively. According to this configuration, heat from the first and second heat conducting sheets 70 and 72 is directly transferred not only to the facing surfaces 42 and 52 of the respective second and third metal housings 40 and 50 but also to the side surfaces 34 of the first metal housing 30. For this reason, there is a tendency for heat to be uniformly radiated from the entire metal housing 28.

In addition, according to the above-described embodiment, a method has been adopted of accommodating the electrical connector 22 in the tube portion 32 of the first metal housing 30, accommodating the circuit substrate 24 between the pair of side surfaces 34 of the first metal housing 30, and then coupling the connector component 64 connected to the coated optical fibers 7, to the lens array component 65 mounted on the circuit substrate 24. However, the present invention is not limited to this example. For example, a configuration may be made such that the connector component 64 connected to the coated optical fiber 7, extracted from the optical cable 3, is coupled in advance to the lens array component 65 on the circuit substrate 24 and then the circuit substrate 24 including the electrical connector 22 and the connector component 64 is accommodated in the first metal housing 30.

This application is based on a Japanese patent application filed on Nov. 1, 2012 (Japanese Patent Application No. 2012-241901), the entire contents thereof being thereby incorporated by reference. In addition, all of the references cited herein are incorporated as a whole.

REFERENCE SIGNS LIST

1: Optical module
3: Optical cable
5: Connector module
7: Coated optical fiber
9: Jacket
11: Tensile strength fiber
13: Metal braid
20: Housing
24: Circuit substrate
26: Resin housing
28: Metal housing
30: First metal housing
32: Tube portion
34: Wall portion (side surface)
36: Fixation portion
40: Second metal housing
42: Facing surface
44: Side surface
50: Third metal housing
52: Facing surface
54: Side surface
60: Control semiconductor
62: Light receiving and emitting element
64: Connector component
65: Lens array component
70: First heat conducting sheet
72: Second heat conducting sheet
S: Accommodation space

The invention claimed is:

1. An electronic device with cable comprising:
a circuit substrate on which a heat generating element is mounted;
an electrical connector connected to one end of the circuit substrate;
a cable connected to the other end of the circuit substrate;
a first metal housing including an accommodation portion which accommodates the electrical connector, and a pair of wall portions which communicate with the accommodation portion;
a second metal housing fitted to the first metal housing so as to cover a one-side opening of the pair of wall portions; and
a third metal housing fitted to the second metal housing so as to cover the other-side opening of the pair of wall portions,
wherein the circuit substrate is accommodated between the pair of wall portions,
wherein the cable and the first metal housing are thermally connected to each other, and
wherein a side surface of the second metal housing and a side surface of the third metal housing are fixed so as to overlap each other on the outside of the pair of wall portions, so that the first metal housing, the second metal housing, and the third metal housing are thermally connected to each other.

2. The electronic device with cable according to claim 1, wherein the cable includes a heat conduction member having a higher thermal conductivity than the first metal housing, the second metal housing, and the third metal housing.

3. The electronic device with cable according to claim 1,
wherein the first metal housing includes a first convex portion,
wherein the second metal housing includes a first concave portion provided at a location corresponding to the first convex portion, and a second convex portion,
wherein the third metal housing includes a second concave portion provided at a location corresponding to the second convex portion,
wherein each of the first convex portion and the second convex portion has a slit in one side thereof, and one side of the slit has a convex shape,
wherein the first concave portion engages with the first convex portion to fix the second metal housing to the first metal housing, and
wherein the second concave portion engages with the second convex portion to fix the third metal housing to the second metal housing.

4. The electronic device with cable according to claim 1, further comprising:
a heat conducting sheet disposed in at least a portion of the circuit substrate.

5. The electronic device with cable according to claim 4,
wherein the heat conducting sheet is accommodated in an accommodation space, formed by the fitting of the first metal housing and the second metal housing and the fitting of the second metal housing and the third metal housing, so as to come into contact with at least one of the second metal housing and the third metal housing.

6. A method of assembling an electronic device with cable, the method comprising steps of:

preparing a circuit substrate having one end connected to an electrical connector;
accommodating the electrical connector in an accommodation portion of a first metal housing and accommodating the circuit substrate between a pair of wall portions that communicate with the accommodation portion; and
connecting a cable to the other end of the circuit substrate;
wherein a second metal housing is fitted to the first metal housing so as to cover a one-side opening of the pair of wall portions, and then a third metal housing is fitted to the second metal housing so as to cover the other-side opening of the pair of wall portions,
wherein the cable and the first metal housing are thermally connected to each other,
wherein the second metal housing is fixed to the first metal housing so that a side surface of the second metal housing covers the pair of wall portions, and
wherein the third metal housing is fixed to the second metal housing so as to cover the side surface of the second metal housing.

7. The method of assembling an electronic device with cable according to claim 6, further comprising steps of:
disposing a heat conducting sheet in at least a portion of the circuit substrate.

8. The method of assembling an electronic device with cable according to claim 7,
wherein the heat conducting sheet comes into contact with at least one of the second metal housing and the third metal housing.

* * * * *